US008754550B2

(12) United States Patent
Chang et al.

(10) Patent No.: US 8,754,550 B2
(45) Date of Patent: Jun. 17, 2014

(54) SELF-CONTAINED APPARATUS/AUTOMATIC DOOR HAVING A NON-CONTACT SENSOR SWITCH ASSEMBLY

(76) Inventors: Cheng-Ju Chang, Taipei (TW); Ta-Yu Su, New Taipei (TW)

( * ) Notice: Subject to any disclaimer, the term of this patent is extended or adjusted under 35 U.S.C. 154(b) by 56 days.

(21) Appl. No.: 13/236,921

(22) Filed: Sep. 20, 2011

(65) Prior Publication Data

US 2013/0067816 A1 Mar. 21, 2013

(51) Int. Cl.
*E05F 15/20* (2006.01)
(52) U.S. Cl.
USPC .......................................... 307/116; 307/117
(58) Field of Classification Search
USPC .................................. 307/116–119
See application file for complete search history.

(56) References Cited

U.S. PATENT DOCUMENTS 7,635,969 B2 * 12/2009 Hoshino et al. ............... 323/277

FOREIGN PATENT DOCUMENTS

| DE | 3938533 A1 | * | 5/1991 |
| WO | WO 9400645 A1 | * | 1/1994 |
| WO | WO 2009075858 A1 | * | 6/2009 |

* cited by examiner

*Primary Examiner* — Fritz M Fleming
(74) *Attorney, Agent, or Firm* — Rosenberg, Klein & Lee

(57) ABSTRACT

A non-contact sensor switch assembly includes a switching transistor adapted for switching on/off the supply of a power supply to the control unit of an automatic handwash dispenser, automatic water tap or automatic door, a charge induction plate inducible by an approaching body part of a person, and a capacitive proximity sensor electrically coupled between the charge induction plate and the switching transistor for triggering the switching transistor to switch on the supply of the power supply to the control unit of the automatic handwash dispenser, automatic water tap or automatic door upon approach of a body part of a person.

4 Claims, 7 Drawing Sheets

SELF-CONTAINED APPARATUS/AUTOMATIC DOOR HAVING A NON-CONTACT SENSOR SWITCH ASSEMBLY

BACKGROUND OF THE INVENTION

1. Field of the Invention

The present invention relates to a self-contained apparatus and more particularly, to a non-contact sensor switch assembly for use in a self-contained apparatus, automatic water tap or automatic door, which automatically switches on (wakes up) the control unit of the self-contained apparatus, automatic water tap or automatic door upon approaching of a body part of a person, or switches off the control unit when the body part of the person is moved out of its effective sensing range.

2. Description of the Related Art

H1N1 new-type influenza, enteroviruses and many other virus variants cause increased infections. In the season when epidemics happen frequently, it is difficult to prohibit spread of infections. The best way to prohibit spread of infections is to wear a mouth mask in public places, to wash the hands frequently, and to avoid using public utilities. To avoid contamination, may public places provide self-contained apparatuses, such as automatic handwash dispenser, automatic sterilizing fluid dispenser, automatic induction water tap and etc. to serve people.

A conventional automatic handwash dispenser 6 or automatic water tap 8 generally use an infrared transmitter/receiver unit 7 for automatic operation control (see FIGS. 8~11). The infrared transmitter/receiver unit 7 consists of an infrared transmitter 71 and an infrared receiver 72 for sensing the approaching of the hands of a user, and electrically coupled to a microprocessor 73 that controls the motor (or relay) 61 of the automatic handwash dispenser 6 or automatic water tap 8 to dispense an anti-bacterial handwash or to discharge water subject to the sensing control of the infrared transmitter/receiver unit 7. When the user moves the hands out of the sensing range of the infrared transmitter/receiver unit 7, the microprocessor 73 switches off the motor (or relay) 61 of the automatic handwash dispenser 6 or automatic water tap 8, stopping the supply of the anti-bacterial handwash or water.

The aforesaid prior art design has drawbacks as follows:
1. The infrared transmitter/receiver unit 7 is constantly at the transmitting and receiving status for sensing the approaching of a body part of a person when electrically connected, wasting much power supply and being easy to fail.
2. The infrared transmitter/receiver unit 7 has a narrow sensing range. A user may be not put the hands accurately in the sensing range of the infrared transmitter/receiver unit 7, causing the automatic handwash dispenser 6 or automatic water tap 8 unable to dispense the anti-bacterial handwash or to discharge water accurately.
3. The light of the sun may interfere with the functioning of the infrared transmitter/receiver unit 7, and therefore the application of the automatic handwash dispenser 6 or automatic water tap 8 is limited.

SUMMARY OF THE INVENTION

The present invention has been accomplished under the circumstances in view. It is one object of the present invention to provide a non-contact sensor switch assembly, which is practical for use in a self-contained apparatus, automatic water tap or automatic door for automatically controlling the operation of the control unit of the self-contained apparatus, automatic water tap or automatic door, saving power consumption and achieving environmentally friendly performance.

To achieve this and other objects of the present invention, a self-contained apparatus comprises a control unit for operation control, and a non-contact sensor switch assembly electrically coupled to the control unit for switching on/off the supply of a power supply to the control unit. The non-contact sensor switch assembly comprises a switching transistor adapted for switching on/off the supply of the power supply to the control unit, and a proximity sensor unit, which comprises charge induction plate inducible by an approaching body part of a person, and a capacitive proximity sensor electrically coupled between the charge induction plate and the switching transistor. The capacitive proximity sensor is changed from Low to High to trigger the switching transistor in switching on the supply of the power supply to the control unit when the charge induction plate is induced by an approaching body part of a person, or changed from High to Low to electrically disconnect the switching transistor when the approaching body part of the person is moved out of the sensing range of the charge induction plate.

To achieve this and other objects of the present invention, an automatic door comprises a control unit, which comprises a signal transmitter unit installed in a sliding door panel and is adapted for controlling opening and closing of the sliding door panel, and a non-contact sensor switch assembly installed in the signal transmitter unit and electrically coupled to a signal transmitter of the signal transmitter unit for switching on/off the supply of a power supply to the signal transmitter. The non-contact sensor switch assembly comprises a switching transistor adapted for switching on/off the supply of the power supply to the signal transmitter, and a proximity sensor unit, which comprises charge induction plate inducible by an approaching body part of a person, and a capacitive proximity sensor electrically coupled between the charge induction plate and the switching transistor. The capacitive proximity sensor is changed from Low to High to trigger the switching transistor in switching on the supply of the power supply to the signal transmitter when the charge induction plate is induced by an approaching body part of a person, or changed from High to Low to electrically disconnect the switching transistor when the approaching body part of the person is moved out of the sensing range of the charge induction plate.

DETAILED DESCRIPTION OF THE PREFERRED EMBODIMENT

Figure 1:
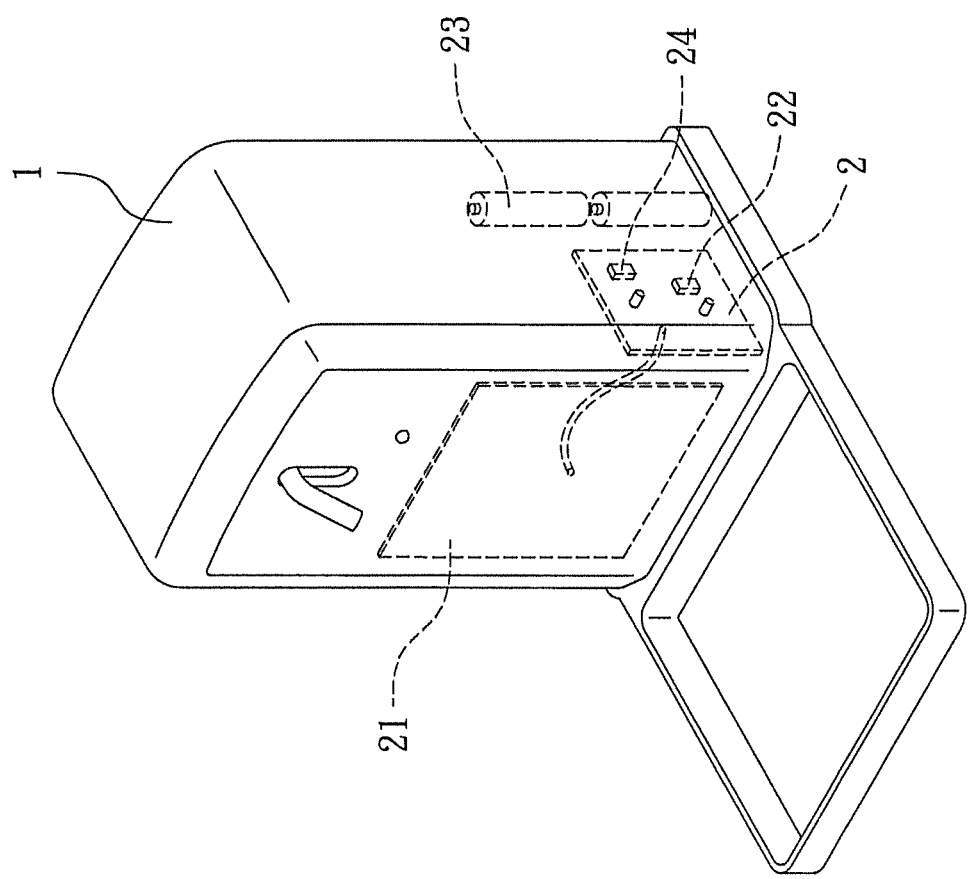
FIG. 1 is a perspective view of an anti-bacterial dispenser equipped with a non-contact sensor switch assembly in accordance with the present invention.
Figure 3:
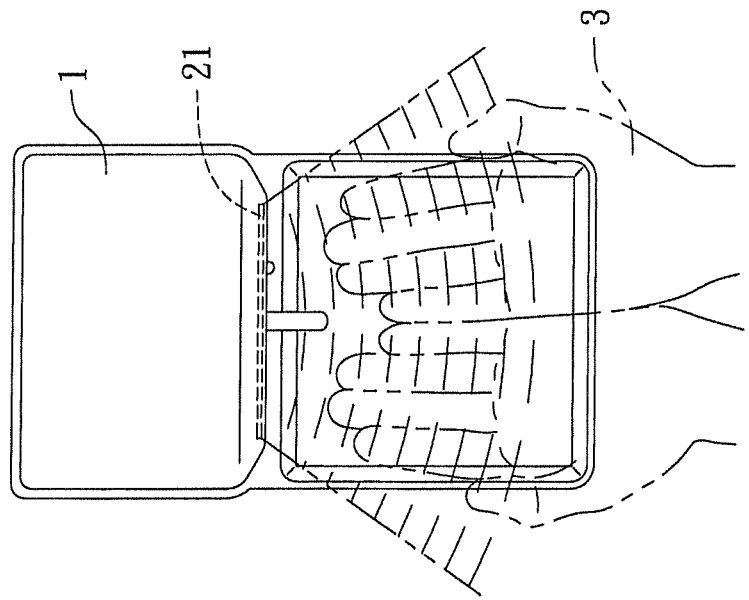
FIG. 3 is a schematic front view of FIG. 2, illustrating the sensing range of the charge induction plate.
Figure 2:
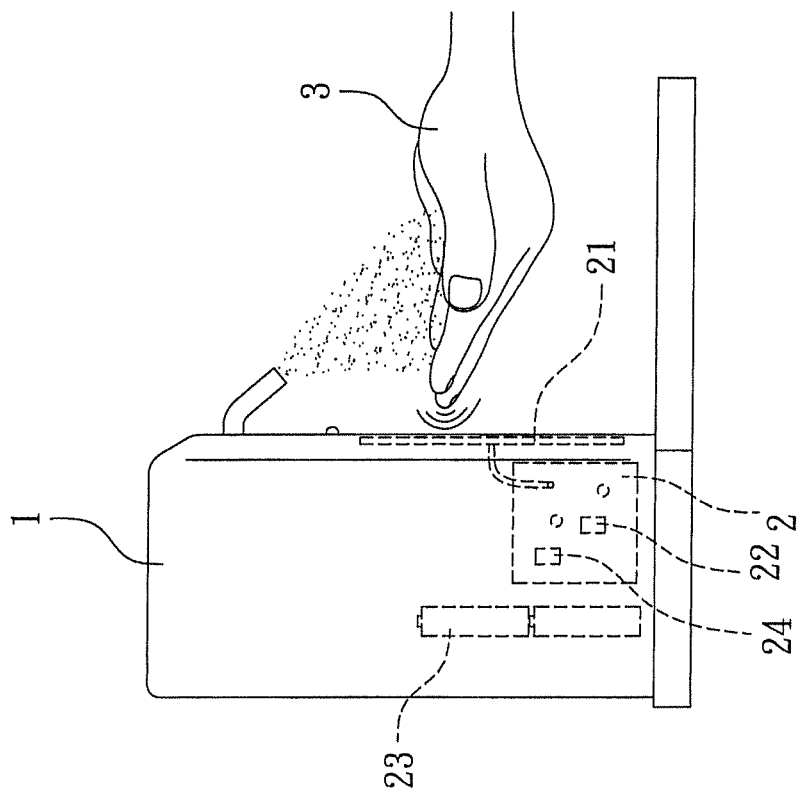
FIG. 2 is a schematic side view illustrating a status of use of the anti-bacterial dispenser of FIG. 1.
Figure 4:
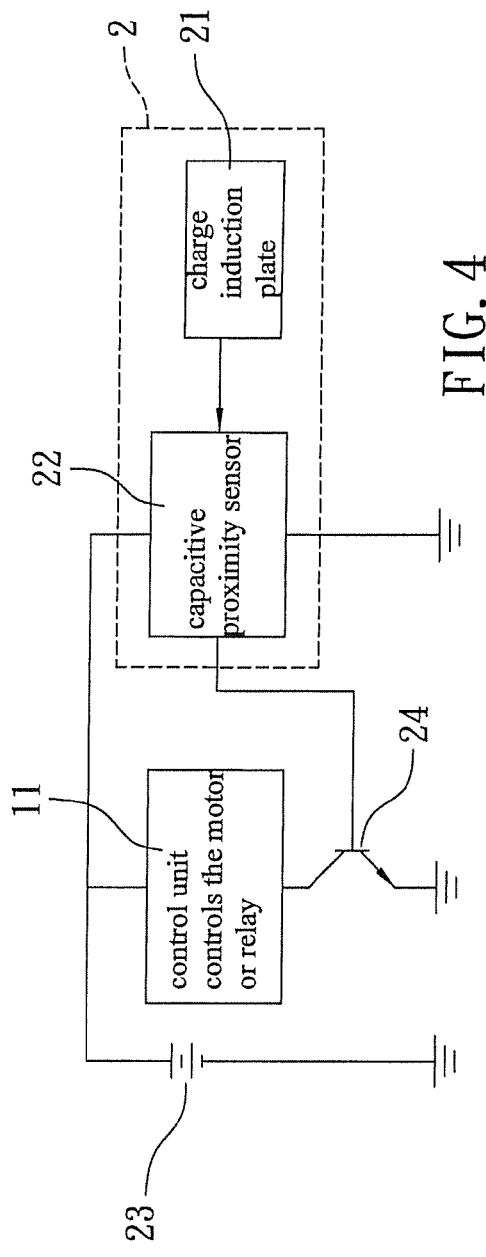
FIG. 4 is a circuit block diagram of the non-contact sensor switch assembly in accordance with the present invention.
Figure 11:
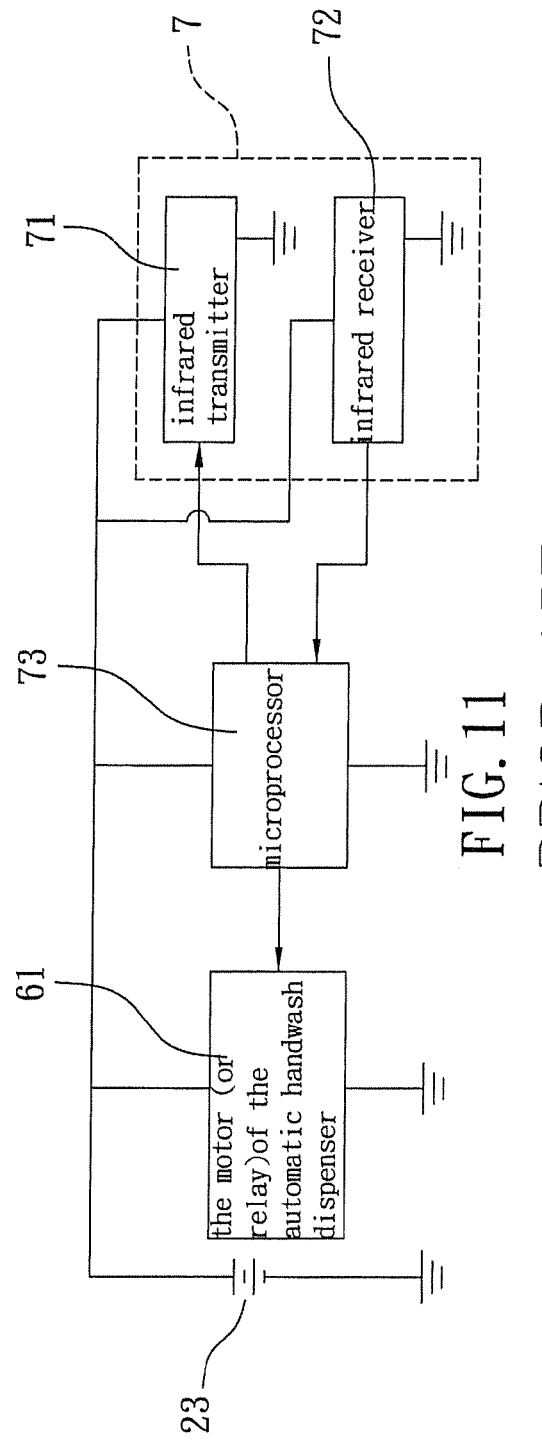
FIG. 11 is a circuit block diagram of the control circuit of the infrared transmitter receiver unit of the conventional automatic water tap.

Referring to FIGS. 1~4, a non-contact sensor switch assembly is shown installed in a self-contained apparatus 1, for example, anti-bacterial handwash dispenser, comprising a switching transistor 24 and a proximity sensor unit 2.

The proximity sensor unit 2 comprises an induction plate (or induction coil) 21, a capacitive proximity sensor 22, and a battery set 23. The charge induction plate 21 is mounted in the casing of the self-contained apparatus 1 and electrically coupled with the capacitive proximity sensor 22 and the battery set 23. The switching transistor 24 is electrically coupled to the proximity sensor unit 2. When the charge induction plate 21 is induced by a trace amount of electric charge from the hand of a person approaching to the self-contained apparatus 1, the output of the capacitive proximity sensor 22 is changed from Low to High, thereby triggering the switching transistor 24 to switch on the power supply of the control unit (i.e., to wake up the control unit) of the self-contained apparatus 1. Thus, the control unit controls the motor or relay 11 of the self-contained apparatus 1 to dispense anti-bacterial handwash or sterilizing fluid. When the hand 3 is moved out of the sensing range of the charge induction plate 21, the capacitive proximity sensor 22 is changed from High to Low, thus, the switching transistor 24 switches off the power supply from the control unit of the self-contained apparatus 1, and therefore the control unit of the self-contained apparatus 1 returns to sleep mode. Subject to the application of the non-contact system of the present invention, the self-contained apparatus 1 saves power consumption, achieving eco-friendly performance.

Figure 5:
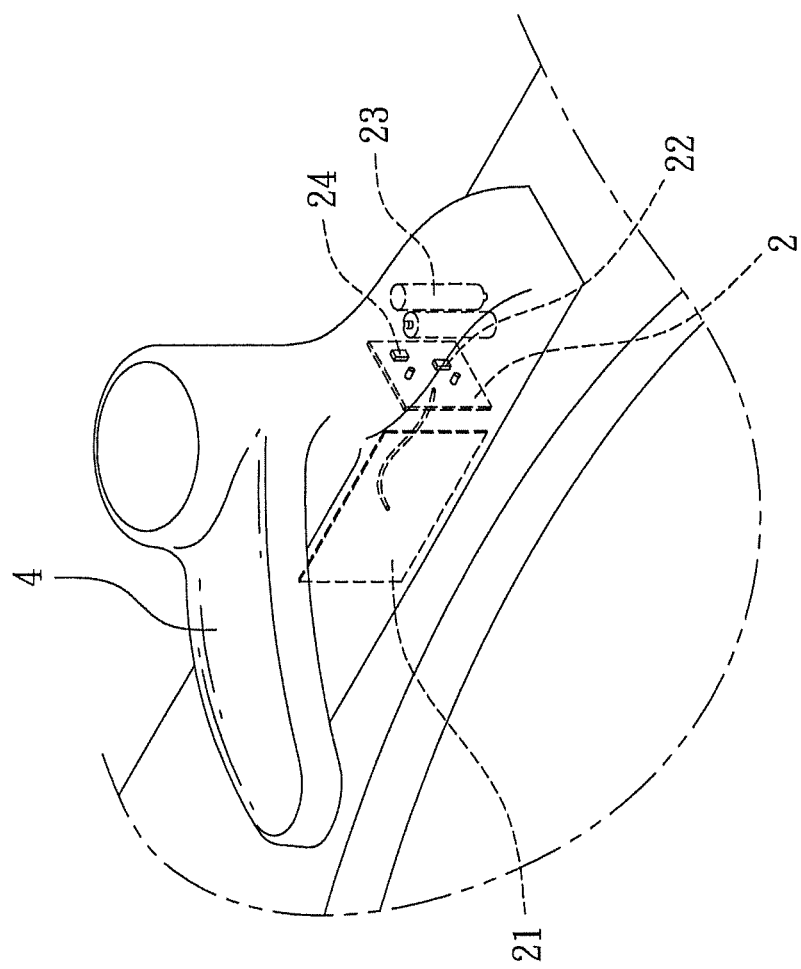
FIG. 5 is a schematic drawing illustrating the non-contact sensor switch assembly used in an automatic water tap in accordance with the present invention.

FIG. 5 illustrates the non-contact sensor switch assembly used in an automatic water tap 4 in accordance with the present invention. As illustrated, the charge induction plate 21 of the proximity sensor unit 2 is installed in the casing of the water tap 4. When a user approaches the hands to the water tap 4, the charge induction plate 21 is immediately induced by a trace amount of electric charge from the hands of the user, the output of the capacitive proximity sensor 22 is changed from Low to High, thereby triggering the switching transistor 24 to switch on the power supply of the control unit (i.e., to wake up the control unit) of the water tap 4. Thus, the control unit controls the water tap 4 to discharge water. When the user moves the hands 3 out of the sensing range of the charge induction plate 21, the capacitive proximity sensor 22 is changed from High to Low, thus, the switching transistor 24 switches off the power supply from the control unit of the water tap 4, and therefore the control unit controls the water tap 4 to turn off water and then returns to sleep mode.

Figure 6:
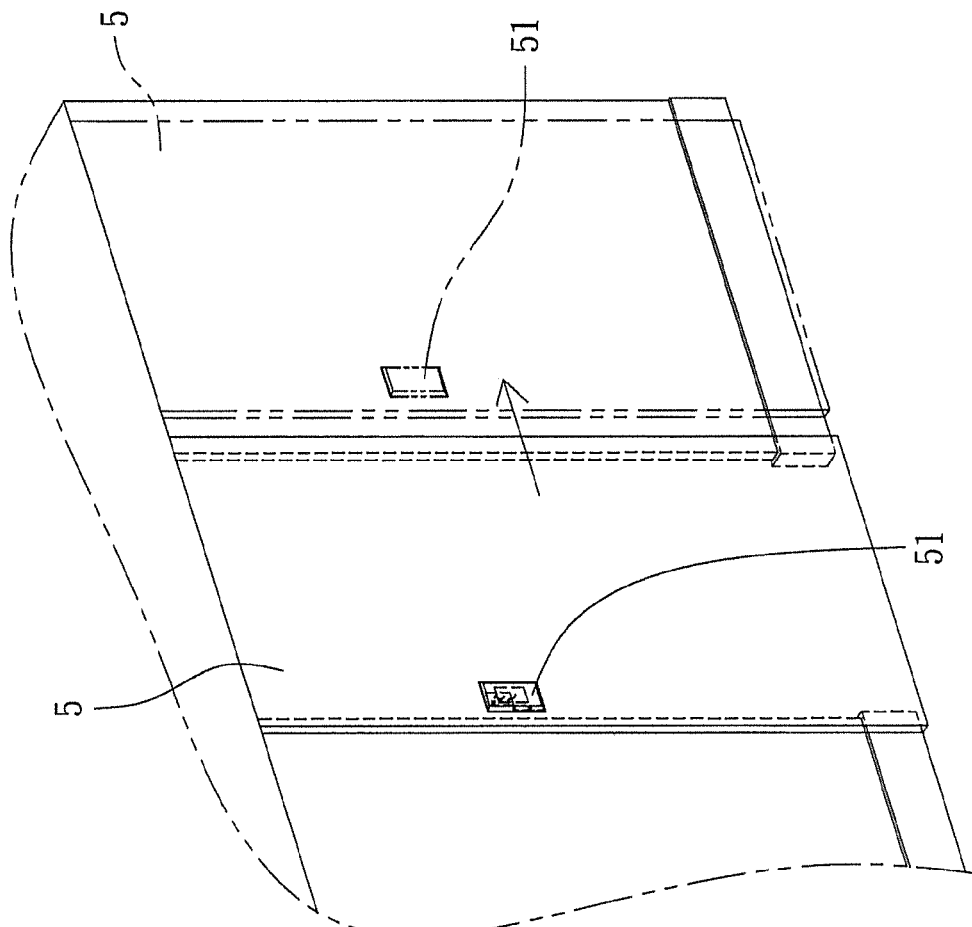
FIG. 6 is a schematic drawing illustrating the non-contact sensor switch assembly used in an automatic door in accordance with the present invention.
Figure 7:
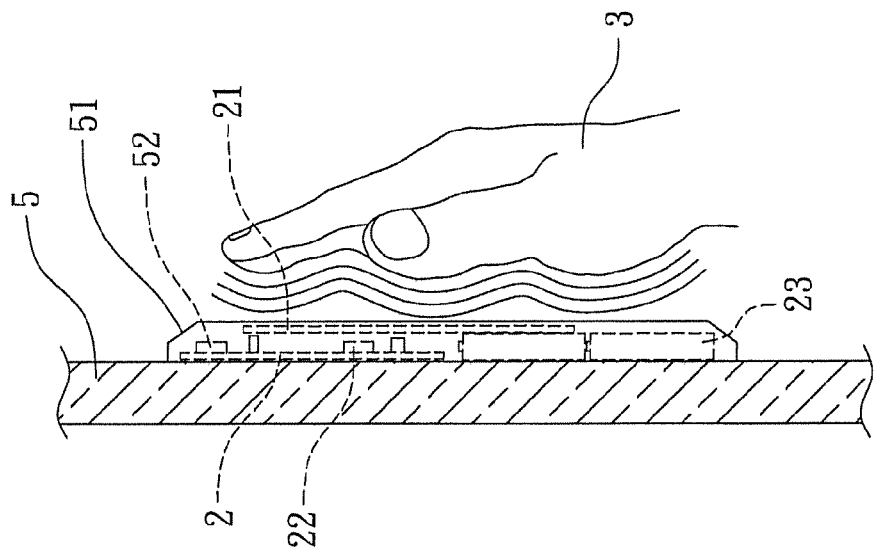
FIG. 7 is a schematic side view illustrating the sensing operation of the proximity sensor unit upon approach of a user hand.
Figure 8:
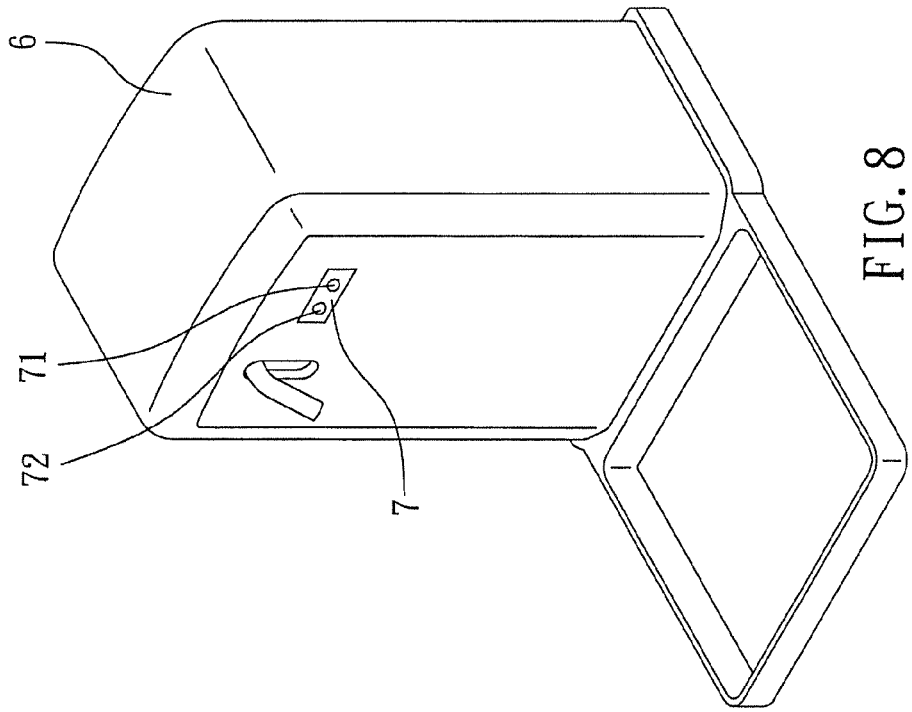
FIG. 8 is an elevational view of a conventional self-contained apparatus.
Figure 7A:
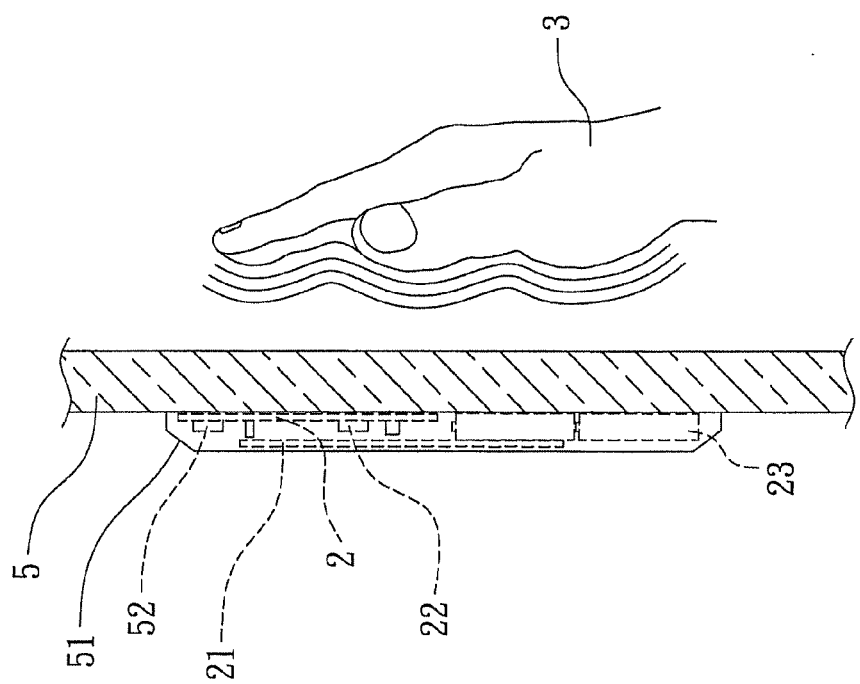
FIG. 7A is a schematic applied view of the present invention, illustrating the proximity sensor unit installed in the back side of the sliding door panel of the automatic door and induced upon approach of a user hand.
Figure 10:
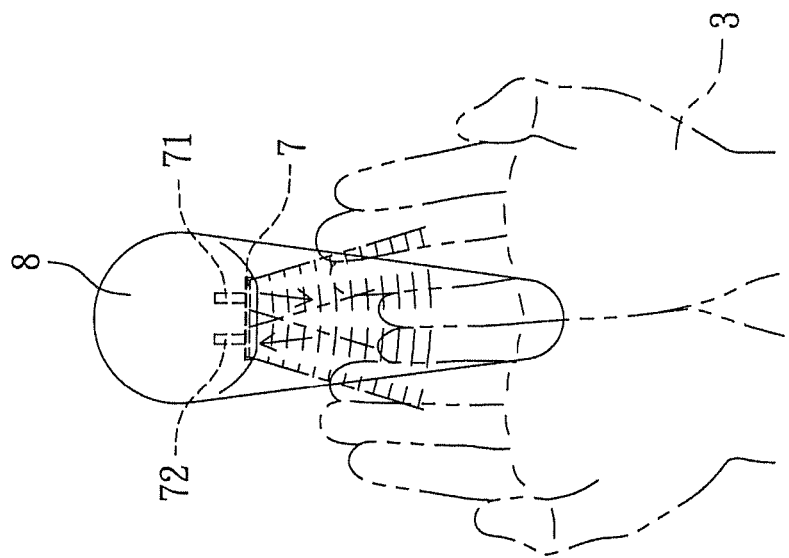
FIG. 10 is a schematic drawing illustrating the sensing operation of the infrared transmitter/receiver unit of the conventional automatic water tap.
Figure 9:
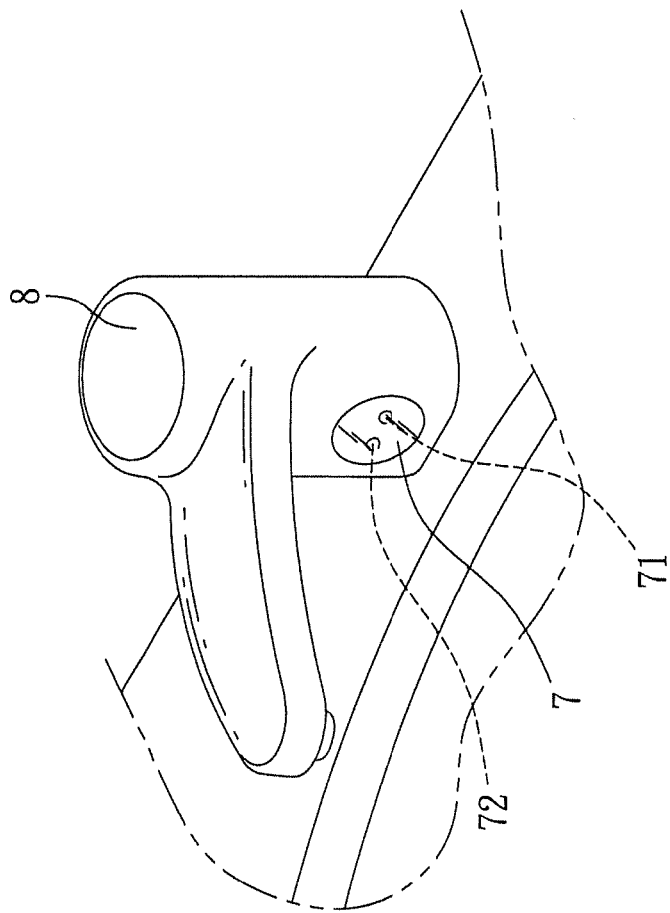
FIG. 9 is a schematic elevational view of a conventional automatic water tap.

FIG. 6 illustrates the non-contact sensor switch assembly used in an automatic door 5 in accordance with the present invention. As illustrated, the non-contact sensor switch assembly is installed in the casing 51 of the signal transmitter 52 of the control unit at the sliding door panel of the automatic door 5. When a user approaches the hands to the casing 51 of the signal transmitter 52, the charge induction plate 21 is immediately induced by a trace amount of electric charge from the hands of the user, the output of the capacitive proximity sensor 22 is changed from Low to High, thereby triggering the switching transistor 24 to switch on the power supply of the signal transmitter 52 of the control unit (i.e., to wake up the control unit). Thus, the control unit controls the automatic door 5 to open the sliding door panel. When the user moves the hands 3 out of the sensing range of the charge induction plate 21, the capacitive proximity sensor 22 is changed from High to Low, thus, the switching transistor 24 switches off the power supply from the signal transmitter 52 of the control unit of the automatic door 5, and therefore the control unit controls the automatic door 5 to close the sliding door panel and then returns to sleep mode (see also FIG. 7). Further, the switching transistor 24 and the proximity sensor unit 2 can also be installed in the back side of the glass sliding panel of an automatic door (see FIG. 7A), achieving the same effects.

Although particular embodiment of the invention have been described in detail for purposes of illustration, various modifications and enhancements may be made without departing from the spirit and scope of the invention. Accordingly, the invention is not to be limited except as by the appended claims.

What the invention claimed is:

1. A self-contained apparatus comprising:
a control unit for operation control,
a non-contact sensor switch assembly electrically coupled to said control unit for switching on/off a power supply for said control unit, the non-contact sensor switch assembly comprising:
a switching transistor for switching on/off said power supply to said control unit, and
a proximity sensor unit, said proximity sensor unit comprising:
a charge induction portion inducible by an approaching body part of a person, and
a capacitive proximity sensor portion electrically coupled between said charge induction portion and said switching transistor, said capacitive proximity sensor being thereby actuated to trigger said switching transistor to switch on the supply of said power supply to said control unit responsive to a change of inductive-capacitive coupling between said charge induction and capacitive proximity sensor portions being induced by an approaching body part of a person, said capacitive proximity sensor being actuated to unswitch said switching transistor when the approaching body part of the person is moved out of the sensing range of said charge induction portion.

2. The self-contained apparatus as claimed in claim 1, which is an anti-bacterial handwash dispenser.

3. The self-contained apparatus as claimed in claim 1, which is an automatic water tap.

4. The self-contained apparatus as claimed in claim 1, wherein said charge induction portion includes an induction coil.

* * * * *